(12) United States Patent
Soman et al.

(10) Patent No.: US 7,517,768 B2
(45) Date of Patent: Apr. 14, 2009

(54) METHOD FOR FABRICATING A HETEROJUNCTION BIPOLAR TRANSISTOR

(75) Inventors: Ravindra Soman, Portland, OR (US); Anand Murthy, Portland, OR (US); Peter VanDerVoorn, Hillsboro, OR (US); Shahriar Ahmed, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/404,781

(22) Filed: Mar. 31, 2003

(65) Prior Publication Data

US 2004/0192002 A1 Sep. 30, 2004

(51) Int. Cl.
*H01L 21/331* (2006.01)
(52) U.S. Cl. ...................... 438/309; 438/312
(58) Field of Classification Search ......... 438/478–483, 438/309–312, 933
See application file for complete search history.

(56) References Cited

U.S. PATENT DOCUMENTS

| | | | |
|---|---|---|---|
| 5,512,772 A | 4/1996 | Maeda et al. | |
| 5,734,183 A | 3/1998 | Morishita | |
| 5,909,059 A * | 6/1999 | Hada et al. | 257/750 |
| 5,962,880 A | 10/1999 | Oda et al. | |
| 6,043,552 A | 3/2000 | Miwa | |
| 6,107,151 A | 8/2000 | Enquist | |
| 6,346,453 B1 | 2/2002 | Kovacic et al. | |
| 6,362,066 B1 | 3/2002 | Ryum et al. | |
| 6,426,265 B1 * | 7/2002 | Chu et al. | 438/312 |
| 6,429,085 B1 | 8/2002 | Pinter | |
| 6,455,871 B1 | 9/2002 | Shim et al. | |
| 6,461,925 B1 | 10/2002 | John et al. | |
| 6,462,397 B2 | 10/2002 | Ryum et al. | |
| 6,667,489 B2 * | 12/2003 | Suzumura et al. | 257/12 |
| 6,759,697 B2 * | 7/2004 | Toyoda et al. | 257/197 |
| 6,905,542 B2 * | 6/2005 | Samoilov et al. | 117/89 |
| 2002/0011617 A1 * | 1/2002 | Kubo et al. | 257/301 |
| 2002/0056414 A1 | 5/2002 | Shim et al. | |
| 2002/0079507 A1 | 6/2002 | Shim et al. | |
| 2002/0168791 A1 * | 11/2002 | De Boer | 438/46 |
| 2002/0182423 A1 | 12/2002 | Chu et al. | |
| 2003/0022528 A1 * | 1/2003 | Todd | 438/933 |

(Continued)

OTHER PUBLICATIONS

Bock et al, "high-Speed SiGe:C Bipolar Technoly" IEEE, IEDM 01-345,pp. 15.5.1-15.5.4.*

(Continued)

*Primary Examiner*—Savitri Mulpuri
(74) *Attorney, Agent, or Firm*—Blakely, Sokoloff, Taylor & Zafman LLP (57) ABSTRACT

A bipolar transistor with a SiGe:C film and a seed layer forming beneath the SiGe:C film and methods of making same. The method includes placing a substrate in a reactor chamber and introducing a silicon source gas into the reactor chamber to form a silicon seed layer. The reactor chamber is maintained at a pressure below 45 Torr and a temperature between about 700° C. and 850° C. After the seed layer is formed, the silicon source gas is stopped. The reactor chamber is then simultaneously adjusted to a pressure between about 70 Torr and 90 Torr and a temperature between about 600° C. and 650° C. The silicon source gas, a germanium source gas, and a carbon source gas are introduced to form the SiGe:C film on the seed layer.

5 Claims, 6 Drawing Sheets

U.S. PATENT DOCUMENTS

| | | | |
|---|---|---|---|
| 2003/0134491 A1* | 7/2003 | Yamagata et al. | 438/478 |
| 2003/0201461 A1* | 10/2003 | Sato et al. | 257/197 |
| 2003/0203599 A1* | 10/2003 | Kanzawa et al. | 438/478 |
| 2004/0007185 A1* | 1/2004 | Moriya et al. | 118/724 |
| 2004/0048439 A1* | 3/2004 | Soman et al. | 438/309 |
| 2004/0065875 A1* | 4/2004 | Ohnishi et al. | 257/19 |
| 2004/0092085 A1* | 5/2004 | Kanzawa et al. | 438/479 |
| 2004/0126978 A1* | 7/2004 | Kalnitsky et al. | 438/309 |
| 2004/0150004 A1* | 8/2004 | Aoki et al. | 257/197 |
| 2004/0198010 A1* | 10/2004 | Koumoto et al. | 438/312 |
| 2004/0227158 A1* | 11/2004 | Delhougne et al. | 257/202 |

OTHER PUBLICATIONS

Osten, H.J., et al., "Carbon Doped SiGe Heterojunction Bipolar Transistors for High Frequency Applications" Bipolar/BiCMOS Circuits and Technology Meeting, 1999.

* cited by examiner

METHOD FOR FABRICATING A HETEROJUNCTION BIPOLAR TRANSISTOR

BACKGROUND

1. Field

Circuit fabrication, including a method for forming a heterojunction bipolar transistor.

2. Description of the Related Art

Bipolar transistors, more specifically heterojunction bipolar transistors (HBTs) are used in devices requiring high frequency operation such as wireless and networking devices. HBTs are used in these devices because of their high cut off frequencies greater than 150 gigahertz (Ghz) even though they consume more power than equivalent metal oxide semiconductor (MOS) based technologies.

HBTs typically consist of an emitter region, base region and collector region. The emitter region generally has a larger band gap than the base region to achieve high frequency performance. The speed at which the HBT can switch is referred to as the cutoff frequency, $f_t$. The cutoff frequency of a given HBT is generally related to the width of its base region. The narrower the base region of a HBT, the shorter the base transit time and higher the cutoff frequency, $f_t$.

Figure 1:
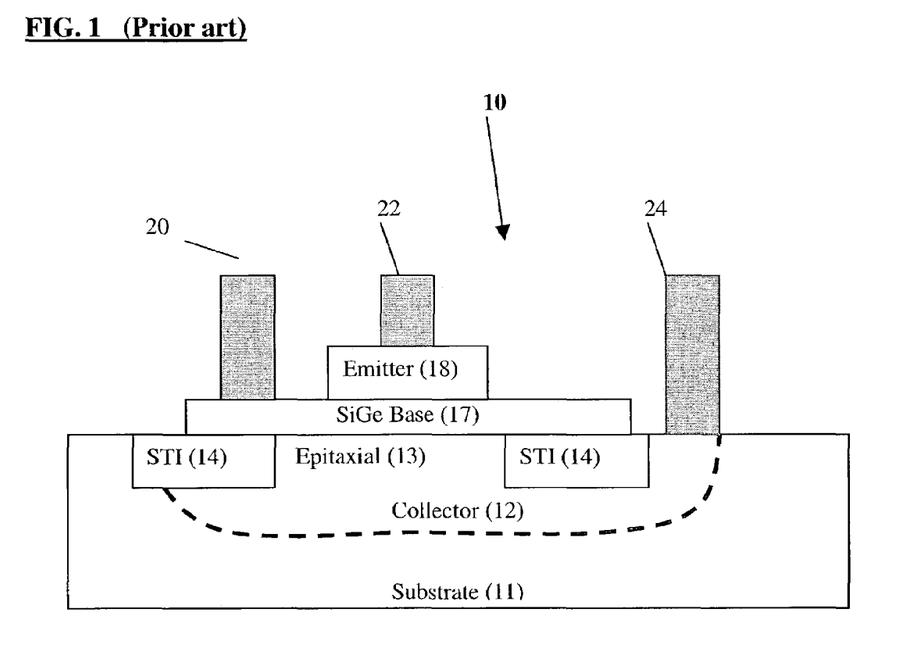
FIG. 1 illustrates a simplified cross-sectional view of a conventional heterojunction bipolar transistor (HBT)

HBTs are typically formed on a silicon substrate and the base region is typically formed in silicon germanium (SiGe) films. For example, as illustrated in FIG. 1, a generic HBT 10 includes a collector layer 12 formed on the surface of a silicon substrate 11. The substrate 11 may include an epitaxial layer 13 and device isolation regions (Shallow Trench Isolation, STI) 14 which is typically comprised of silicon oxide. A thick layer of SiGe film containing boron is formed on the substrate 11 and over the entire surface area of the epitaxial layer 13. The SiGe film is used to form the SiGe base region 17 of the HBT 10. An emitter 18 is formed over an area of the SiGe base region 17. The emitter 18 comprises of a silicon film. Contacts are also provided for the emitter 18, the collector layer 12, and the SiGe base region 17 as shown in FIG. 1 (e.g., contacts 20, 22, and 24).

Current methods for depositing the SiGe film to form the base region have several disadvantages. As can be seen from FIG. 1, the SiGe film is typically deposited over different surfaces, for example, over the epitaxial layer 13 and the isolation regions 14 which is usually a silicon oxide layer. It is thus common that the SiGe film is deposited over different surfaces that include a silicon surface and an oxide surface. There is a significant difference in nucleation time, residence time, sticking coefficient, or deposition rate of the SiGe film over the silicon and the oxide surfaces. Depositing the SiGe film over the different surfaces using the current method leads to non-uniform and discontinuous film. One reason for that is that the SiGe film is deposited more selectively over silicon surface than on oxide surface.

Discontinuous deposition of the SiGe film results in discontinuous base contact, which leads to an increase in contact resistance and/or extrinsic base resistance. Increase resistance in turn results in a degradation of $F_{max}$ (Oscillation frequency).

BRIEF DESCRIPTION OF THE DRAWINGS

The disclosure is illustrated by way of example and not by way of limitation in the figures of the accompanying drawings in which like references indicate similar elements. The invention may best be understood by referring to the following description and accompanying drawings that are used to illustrate embodiments of the invention. In the drawings.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

For the purpose of this disclosure, a silicon germanium film is denoted as a "SiGe" film. A silicon germanium film that has carbon incorporated into the film is denoted as a "SiGe:C" film.

One aspect of the present invention deals with forming a bipolar transistor with a SiGe:C film and a seed layer forming beneath the SiGe:C film and methods of making the same. In one embodiment, the method includes placing a substrate in a reactor chamber and introducing a silicon source gas into the reactor chamber to form a silicon seed layer. The reactor chamber is maintained at a first pressure and a first temperature. After the seed layer is formed, the silicon source gas is stopped. The reactor chamber is then simultaneously adjusted to a second pressure and a second temperature. The silicon source gas, a germanium source gas, and a carbon source gas are then introduced to form the SiGe:C film on the seed layer. The seed layer is formed at a pressure that is substantially lower than the pressure used to form the SiGe:C film and at a temperature that is higher than the temperature used to form the SiGe:C film. In one embodiment, the first pressure is no greater than 45 Torr and a temperature is at least about 700° C. and no greater than 850° C. In one embodiment, the second pressure is between at least about 70 Torr and no greater than 90 Torr and the second temperature is at least about 600° C. and no greater than 650° C.

Prior to describing alternative embodiments of forming the SiGe:C film and the bipolar transistor having such an SiGe:C film, a brief description of an embodiment of a reactor chamber that can be used for these embodiments is appropriate.

Figure 2:
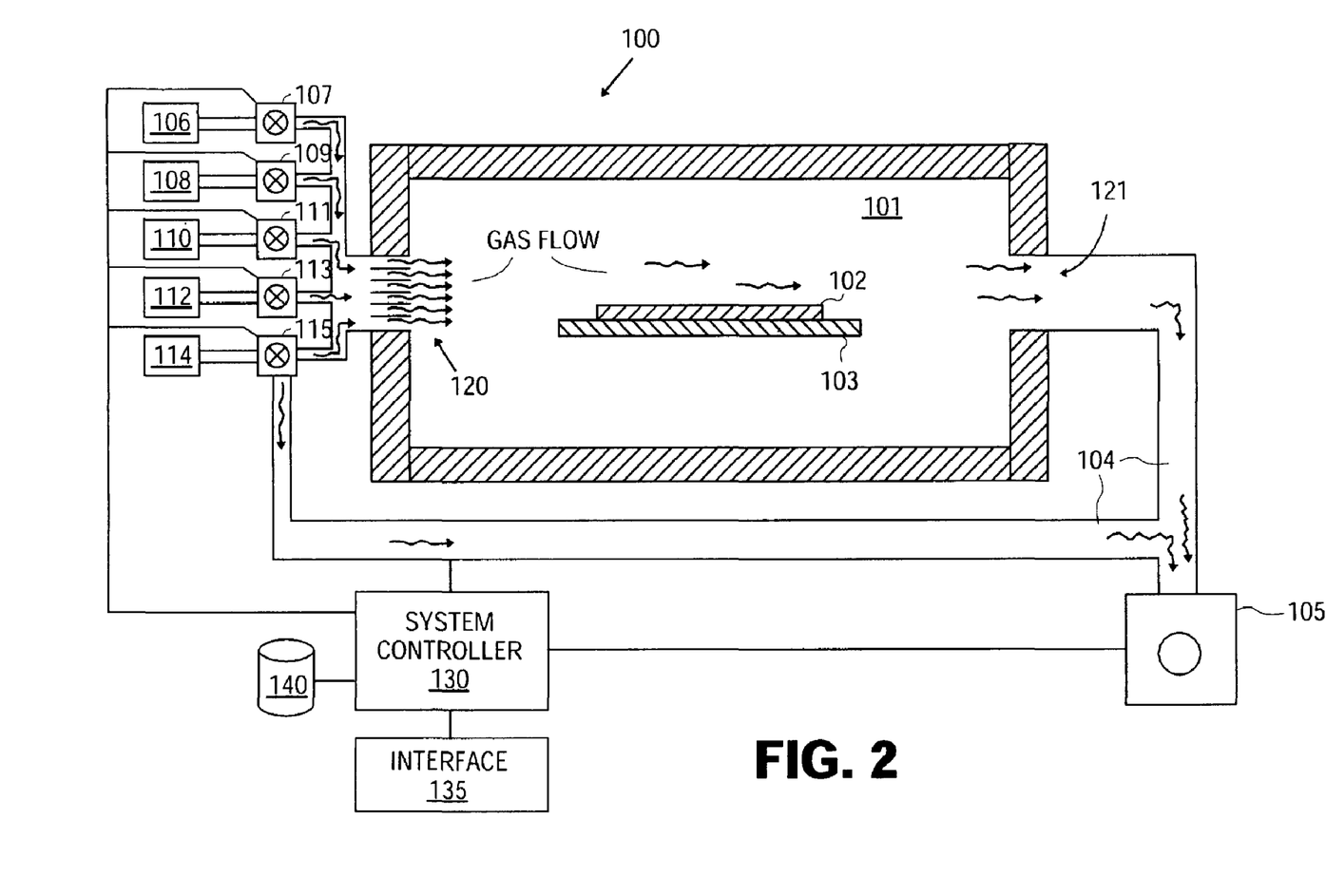
FIG. 2 illustrates an exemplary reactor that can be used to carry out some embodiments of the present invention.

FIG. 2 illustrates a reactor 100 that can be used for some of the embodiments of the present invention. The reactor 100 includes a reactor chamber 101. In one embodiment, the chamber is that of an Epsilon® E3000 300 millimeters (mm) Epitaxial Reactor or E2500 or E2000 200 mm Epitaxial Reactor manufactured by ASM, Inc. Within the reactor chamber 101 is a wafer holder 103 for securing a substrate 102 onto which depositions are to be made. The reactor 100 also includes a heat source (not shown) disposed in the reactor chamber 101, such as in the wafer holder 103. The temperature within the reactor chamber 101 may be monitored by one or more temperature gauges (not shown). Source gases (e.g., silicon source gas, germanium source gas, carbon source gas, and dopant source gas) and carrier gases (e.g., hydrogen, nitrogen, argon, and helium) enter the reactor chamber 101 at a port 120, flow through the reactor chamber 101, and exit the reactor chamber 101 via a chamber exhaust port 121 and a chamber exhaust 104. The chamber exhaust 104 is coupled to a vacuum 105, which maintains a desired pressure within the reactor chamber 101. The pressure within the reactor chamber 101 may be monitored by one or more pressure gauges (not shown). In one embodiment, the temperature gauges and/or the pressure gauges are coupled to a process controller (e.g., a system controller 130) that regulates the temperature and pressure within the reactor chamber 101.

Introduction of gases into the chamber is managed by manifold control valves 107, 109, 111, 113, and 115. The source and carrier gases are generated at source points 106, 108, 110, 112, and 114. In one embodiment, the control manifold valves are coupled to a system controller 130. In some embodiments, the source gas includes a silicon source gas, a germanium source gas, a carbon source gas, and a dopant source gas. The carrier gas can include a hydrogen gas, nitrogen gas, helium gas, argon gas, or other suitable dilution gas. In other embodiments, the source gas may include precursor gases that can produce one or more of ions or radicals of a constituent that upon introduction into a substrate produces carriers such as electrons or holes.

In one embodiment, the substrate 102 may be a semiconductor wafer such as a silicon wafer (e.g., a 300 millimeter (mm) diameter silicon wafer). Alternatively, the substrate 102 can be a monocrystalline silicon. Alternatively yet, the substrate 102 may be a silicon-on-insulator (SOI) substrate such as a single crystal silicon film on an insulator.

In one embodiment, the system controller 130 controls the environmental conditions and process elements in the reactor chamber 101 including the manifold control valves 107, 109, 111, 113 and 115 and other process related devices. The system controller 130, for example, controls the process temperature and pressure in the reactor chamber 101, flow rates of source and carrier gases into the reactor chamber 101, and the timing of source gases released into the reactor chamber 101. In one embodiment, the system controller 130 receives input from a user to set any of the environmental conditions, process steps, or to create a set sequence of changes for the process elements or environmental conditions. In one embodiment, the system controller 130 is coupled to a memory storage device 140 comprising a machine-readable medium having a machine-readable program embodied therein for directing operation of the system or the reactor 100. In one embodiment, user input is given to the system controller 130 using a system controller interface 135 (e.g., a keyboard, a mouse, a touch screen, a monitor, etc . . . ).

Figure 3A:
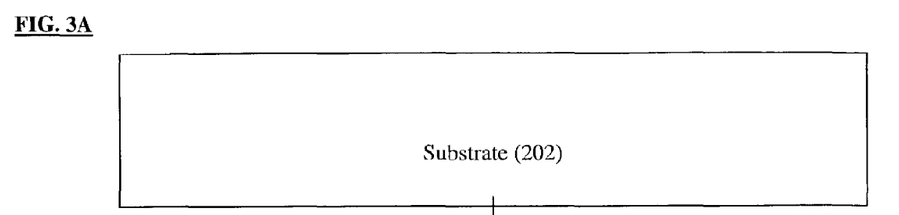
FIGS. 3A-3F is a schematic representation of the processing steps of making a semiconductor device according to some exemplary embodiments of the present invention.

FIGS. 3A-3F illustrate an exemplary embodiment of making a semiconductor device such as a bipolar transistor or a heterojunction bipolar transistor (HBT). FIG. 3A illustrates a substrate 202, which in one embodiment, is a monocrystalline silicon wafer. The substrate 202 may include an epitaxial layer (not labeled) on the top portion of the substrate 202. In other embodiments, the substrate 202 can be a silicon-on-insulator (SOI) substrate such as a single crystal silicon film on an insulator or other suitable semiconductor substrate wherein the device is formed into single crystal silicon films. In one embodiment, the substrate 202 is a p-type doped substrate. The substrate may also be an n-type substrate in other embodiments.

Figure 3B:
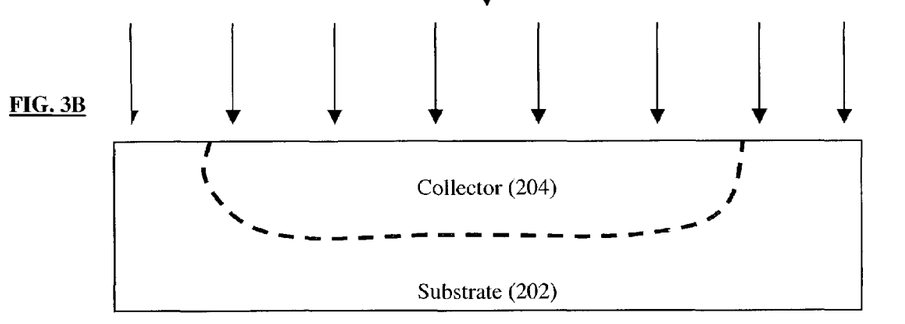

FIG. 3B illustrates that a collector region 204 is formed into the substrate 202 using conventional methods. In one embodiment, the collector region 204 is formed in the epitaxial portion of the substrate 202. In one embodiment, the collector region 204 is formed by using methods such as solid-state diffusion or ion-implantation to implant impurities into certain region of the substrate 202 to make the collector region 204 an n-type collector or a p-type collector. In an embodiment where the substrate 202 is a p-type substrate, the collector region 204 is made to be an n-type collector. In another embodiment, where the substrate 202 is an n-type substrate, the collector region 204 is made to be a p-type collector.

Figure 3C:
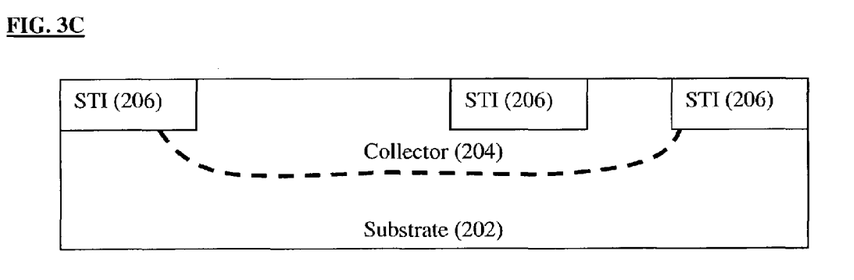

FIG. 3C next illustrates that field isolation regions 206 (e.g., shallow trench isolation, STI 206) are formed in the substrate 202. In one embodiment, the top layer of the substrate 202, which in some cases is the epitaxial layer, is locally oxidized (for example, by the a LOCOS (local oxidation of silicon) method so as to form the isolation regions 206). In some embodiments, the surface of the substrate 202 including the collector region 204 and the STI 206 are planarized using conventional methods.

Figure 3D:
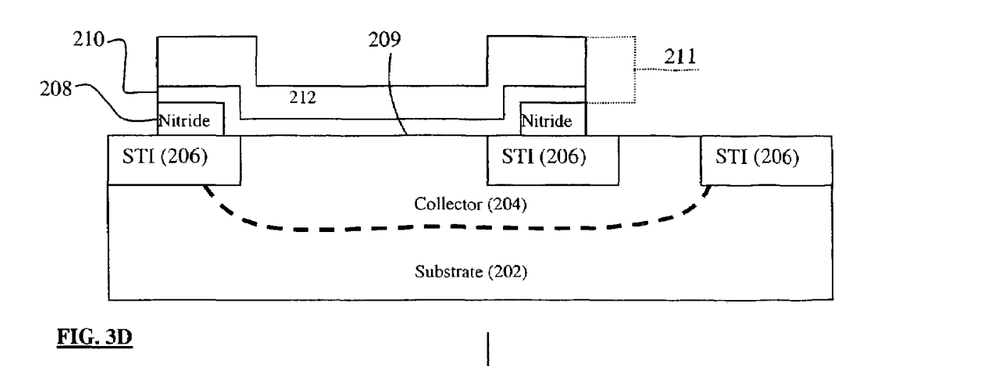

FIG. 3D illustrates that in one embodiment, an insulation film is formed over an area of the substrate 202. In one embodiment, a nitride film is deposited over an area of substrate 202. The nitride film can be deposited using conventional methods and using the reactor chamber 101 previously described. The nitride film is then patterned and etched using conventional methods (e.g., photolithography and etching) to form nitride regions 208 and exposed opening 209 exposing an area of the substrate 202 where the base region 211 and the emitter 217 (see FIGS. 3E-3F) of the device can later be formed.

A seed layer 210 is formed over the exposed region and then a silicon germanium (SiGe) film 212 is formed over the seed layer 210. In most cases of HBTs, the base layers are comprised of SiGe films. To facilitate the SiGe film forming upon the substrate 202, a silicon seed layer 210 is first formed over the area where the SiGe film 212 will be forming. The seed layer 210 can be a single crystal semiconductor or a single crystal silicon. The silicon seed layer provides a nucleation site to facilitate the nucleation and growth of the SiGe film 212.

As can be seen, a SiGe film and/or a SiGe film with a silicon seed layer is often deposited over several different surfaces, for example, a silicon surface which is the exposed area of the substrate 202 upon which the HBT is fabricated, an oxide surface such as the surface of the STI region 206, and in some cases, a nitride surface such as the surface of the nitride regions 208. There are inherent differences in nucleation time, growth rate, deposition rate, and/or sticking coefficient of the SiGe film and/or the silicon seed layer that are deposited over different surfaces. Depositing the SiGe film and/or the SiGe film with the silicon seed layer over the different surfaces using the conventional methods lead to non-uniformity and discontinuous regions (e.g., voids, breaks, or discontinuity) in the films. One reason for that is that silicon and SiGe is generally more selectively formed over silicon surface than dielectric surfaces such as nitride and oxide surfaces. As mentioned above, discontinuous deposition of the SiGe film and/or the SiGe film with the silicon seed layer over the oxide region 206 and nitride region 208 results in discontinuous base contact, which leads to an increase in contact resistance and/or extrinsic base resistance. For example, current flows through contacts and into the base region of the HBT. Unevenness, discontinuity, or roughness in the SiGe film that is used to form the base region causes the current flow to be reduced in turn causing high contact resistance. Increase resistance in turn results in a degradation of $F_{max}$ (Oscillation frequency).

To prevent high contact resistance, the seed layer and the SiGe film that are deposited over the oxide region 206 and the nitride region 208 must be uniform and continuous. To prevent discontinuous deposition of the seed layer and the SiGe film over the different surfaces, the deposition process of the seed layer and the SiGe film are divided into a two-step process. As will be seen below, the seed layer is deposited at a higher temperature and a substantially lower pressure than the SiGe film, which is deposited at a lower temperature, and a higher pressure. In one embodiment, the seed layer 210 is a silicon seed layer 210. The silicon seed layer 210 is formed at a higher temperature setting than that for the SiGe film. In this embodiment, the silicon seed layer 210 is formed at a high temperature and low pressure using a silicon source gas that can be introduced into the reactor chamber 101 in the manners described above. The temperature at which silicon seed layer 210 is formed is chosen such that it is not too high so as to cause diffusion of dopants that may have been incorporated into various regions of substrate 202 and high enough to facilitate uniform and continuous deposition of the silicon seed layer 210 over the various different surfaces such as the oxide region 206, the nitride region 208, and the opening 209 (which is an epitaxial substrate region). The pressure at which silicon seed layer 210 is to be formed is chosen such that it allows for sufficiently uniform and continuous deposition on all of the different surfaces present on substrate 202. It has been observed that pressure above 45 Torr allows smooth and continuous deposition of the silicon seed layer 210 over silicon surface and nitride surface. However, at pressured above 45 Torr, there is still some discontinuous sections observed in the silicon seed layer 210 that is formed over the oxide surface 206. High temperature and pressure below 45 Torr is found to allow smooth, uniform, and continuous deposition of the silicon seed layer 210 over the epitaxial silicon surface (e.g., the opening 209), the oxide surface (e.g., the oxide region 206), and the nitride surface (e.g., the nitride region 208). Using this approach, the seed layer 210 is substantially uniform, no discontinuity, breaks, or voids in the film.

In one embodiment, the silicon seed layer 210 is formed at a pressure below 45 Torr, and ideally, between 10-30 Torr and at a temperature above 680, and ideally, between 700° C. and 800° C. In another embodiment, the silicon seed layer 210 is formed at a pressure about 30 Torr and at a temperature about 725° C. In yet another embodiment, the silicon seed layer 210 is formed to have a thickness of about 30-40 nm. In other embodiments, the silicon seed layer 210 has a thickness between 10 and 50 nm. The silicon seed layer 210 is continuous and uniform over all different surfaces on the substrate 202.

In one embodiment, to form the silicon seed layer 210, a 100 standard cubic centimeter per minute (sccm) flow of a silicon source gas is introduced into the reactor chamber 101 through the associated manifold control valve 107 from the source point 106. The flow rate of the silicon source gas may be varied depending on the volume of the reactor chamber, the type of the reactor chamber, and the concentration of the silicon in the silicon source gas. In one embodiment, the silicon source gas is silane ($SiH_4$). Other silicon source gases such as disilane or dichlorosilane can also be used for this purpose. In one embodiment the silicon source gas is $SiH_4$ and contain about 1% $SiH_4$ in a $SiH_4$ and $H_2$ mixture. The flow of 100 sccm listed herein is only for illustration purpose and is not to be taken as a limitation of the embodiments.

In one embodiment, after the silicon seed layer 210 is formed, a silicon germanium (SiGe) film 212 is deposited over the silicon seed layer 210. The silicon seed layer 210 and the SiGe film 212 form the base region 211 of the device. As will be apparent from below, carbon is usually substitutionally incorporated into the SiGe film 212 to prevent diffusion of the dopants that will be incorporated into the SiGe film 212. The substitutional incorporation of carbon into the SiGe film 212 requires that the SiGe film 212 be formed at a low temperature, for example, from 600-650° C. When carbon is incorporated into the SiGe film 212 at a high temperature, for example, at 700° C., carbon will deposit into interstitial sites of the silicon atoms instead of the substitutional site of, the silicon atoms as is needed to prevent the diffusion of the dopants such as boron during subsequent processing steps, for example, during subsequent annealing processes. Diffusion of boron makes the base region effectively wider and thereby reducing performance. Therefore, the SiGe film 212 is formed at a lower temperature than that used to form the silicon seed layer 210. In embodiments where the SiGe film 212 is formed following the formation of the silicon seed layer 210 and using the same reactor chamber 101, the silicon source gas used to form the silicon seed layer 210 is halted, and the pressure and temperature of the reactor chamber 101 are simultaneously adjusted prior to the introduction of the source gases that are used to form the SiGe film 212.

In one embodiment, to form the SiGe film 212, the silicon source gas and a germanium source gas are introduced into the reactor chamber 101. The silicon source gas can be the same silicon source gas that is used to form the silicon seed layer 210 discussed above, e.g., $SiH_4$. In one embodiment, after the adjustment of the temperature and pressure of the reactor chamber 101 as discussed above, the silicon source gas is re-introduced into the reactor chamber 101 together with a germanium source gas. In one embodiment, the germanium source gas is germane ($GeH_4$). Other germanium source gases include dichlorogermane. In one embodiment, the SiGe film 212 is formed at a pressure between 70 Torr and 90 Torr, and ideally, at about 80 Torr, and at a temperature about below 680° C., and ideally, between 600° C. and 650° C. In another embodiment, the SiGe film 212 is formed at a pressure about 80 Torr and at a temperature about 600° C. In one embodiment, the SiGe film 212 has a thickness of about 30-100 nm. As mentioned above, the silicon seed layer 210 and the SiGe film 212 form the base region 211 of the device whereas the base region 211 may have a total thickness between about 50 and 250 nm.

In one embodiment, the SiGe film 212, comprises graded germanium. Starting from the top surface of the silicon seed layer 210, the concentration of germanium begins with about 0% and gradually increases to about 10-35% at the top region of the SiGe film 212. In one embodiment, an initial flow rate of the germanium source gas (e.g., $GeH_4$) is about 45 sccm. The germanium source gas is introduced into the reactor chamber 101 through the manifold control valve 109 from the source point 108 (See FIG. 2). In one embodiment, the percentage of the germanium in the germanium source gas is one percent with the remainder a carrier gas such as hydrogen $H_2$.

In one embodiment, to form the SiGe film 212 that includes graded germanium, the germanium source gas flow is ramped up to a rate between about 120 sccm and 1250 sccm within several seconds (e.g., 10-40 seconds) of introduction into the reactor chamber 101. In this embodiment, the silicon source gas flow is held constant, for example at a flow rate of about 50 sccm, during the ramp up period. This mixture of gases in the reactor chamber 101 results in the concentration of germanium in the deposition on SiGe film 212 to rapidly grade from about 0% to about 10-35%. This forms the silicon germanium (SiGe) film 212 over the silicon seed layer 210 as illustrated in FIG. 3D. (The percentage of germanium in the SiGe film 212 can be measured using Secondary Ion Mass Spectrometry (SIMS)).

It is to be noted that the flow rate examples listed in various embodiments in the disclosure are for process volume for the reactor chamber 101, which, in one example, may have a process volume of about 3-5 liters. In one embodiment, process volume refers to the space in the reactor chamber 101 that is above the wafer holder 103. Thus, the flow rates for any of the gases may be varied according to the size of the particular reactor or the process volume of the reactor chamber-without deviating from the scope of the embodiments.

As mentioned above, carbon needs to be incorporated substitutionally into the SiGe film 212 to prevent boron diffusion. In one embodiment, a carbon source gas such as methyl silane ($CH_3SiH_3$) is introduced into reactor chamber 101 after the germanium source gas is introduced to incorporate carbon into the SiGe film 212. In one embodiment, the carbon source gas is introduced into reactor chamber 101 through the manifold control valve 111 from the source point 110. Carbon gets substitutionally incorporated into the forming SiGe film 212 to create a SiGe:C film 212. In this case, the silicon seed layer 210 and the SiGe:C film 212 form the base region 211 of the device. In one embodiment, the percentage of methyl silane in the carbon source gas is approximately 2 percent with the remainder a carrier gas such as $H_2$. In another embodiment, the carbon source gas is introduced into the reactor chamber 101 approximately when the germanium source gas is introduced. In one embodiment, the carbon source gas is introduced at a constant flow rate of about 20 sccm until completion of depositions. Note that this flow rate may be varied depending on the reactor and the reactor size as mentioned above. At the completion of the deposition, the SiGe film 212 becomes a SiGe:C film 212.

Carbon substituted in the manner described above into the SiGe lattice serves as a diffusion suppressant for boron (or other suitable dopants). In one embodiment, the SiGe:C film 212 limits initial diffusion of boron to a narrow base region. Widening of the doped base region during subsequent processing, especially during annealing of the substrate subsequent to the formation of the bipolar transistor are likewise limited by the SiGe:C film 212. For example, subsequent annealing processes may expose the bipolar transistor to temperatures up to 1080° C. However, carbon substitutionally combined in the SiGe lattice as in this embodiment can limit diffusion of, for example, boron and maintain the width of a boron doped base region of 10 nm width to a width of 14 nm after annealing (in an embodiment where the SiGe film is made to be about 10-50 nm in width). The SiGe:C film 212 formed using the embodiments described is substantially uniform, e.g., minimal to no discontinuity, voids, or breaks in the film.

In one embodiment, the SiGe:C film 212 is doped with a dopant such as boron. Other dopant can be used depending on the type of the base region to be formed. For example, boron and indium can be used when the base region is formed to be a p-type base region and phosphorous and arsenic can be used when the base region is formed to be an n-type base region. When the collector region 204 is an n-type collector region, the base region 211 is formed to be a p-type region; and when the collector region 204 is a p-type collector region, the base region 211 is formed to be an n-type region. The SiGe:C film 212 can be doped with the dopant in situ. In one embodiment, boron may be used when the SiGe:C film 212 is doped with impurities to make it a p-type SiGe:C film. In this embodiment, after the SiGe:C film 212 is formed over the silicon seed layer 210, the germanium source gas flow is slowly ramped down from its peak flow (e.g., between 120 and 250 sccm). During the period when the germanium source gas is ramped down, the manifold flow control valve 115 for a dopant source gas, such as diborane ($B_2H_6$), releases the dopant source gas into the reactor chamber 101 through the source point 115. In one embodiment, the dopant source gas is diborane gas, which in one embodiment has a concentration of 1 percent diborane with the remainder a carrier gas such as $H_2$. In one embodiment, the dopant source gas is introduced into the reactor chamber 101 from the source point 114. The manifold control valve 115 associated with the source point 114 for the dopant source gas directs the dopant source gas flow directly to the reactor exhaust 104. A steady state of dopant source gas flow is established in the associated manifold control valve 115. In another embodiment, the dopant source gas flow is directed to the exhaust 104 by the manifold control valve 115 before the germanium flow ramp down begins.

In one embodiment, when the germanium source gas flow grades down from the peak flow (e.g., 120 sccm-250 sccm) to about half of its peak flow, (e.g., about 75 sccm), the dopant source gas is introduced into the reactor chamber 101 by the manifold control valve 115 at a steady state. In one embodiment, a dopant source gas flow is introduced at a steady rate of about 20 sccm during deposition. In one embodiment, the dopant source gas flow introduction is "flashed" into the reactor chamber 101. A representative flash of dopant source gas is on the order of a few seconds, e.g., three seconds. In this embodiment, during the dopant source flash period, the germanium source gas flow is further reduced, for example, from 75 sccm to 70 sccm. In one embodiment, a 10 nm doped base region of the transistor is formed.

In an embodiment where the dopant source gas is diborane, a 20 sccm flow of diborane gas forms a $8 \times 10^{19}$ carriers per cubic centimeter peak concentration doped base region. In other embodiments, the diborane gas flow rate is varied up to 60 sccm. At 60 sccm, a peak concentration of $2 \times 10^{20}$ carriers per cubic centimeter is achieved.

The variables of the dopant source gas flow flash, including the length of the flash period, rate of gas flow, and concentration of the source gas, can be varied to achieve predictable results. The dopant source gas flash can be for a lengthened period of time resulting in a wider doped base region including flash periods up to 20 seconds in length. Dopant source gas flashes with duration of less than three seconds tend not to produce base regions with sufficient dopant concentration levels.

In one embodiment, the SiGe:C film 212 continues to be formed after the dopant source gas flash is completed and the doped region has been formed. The silicon source gas and the germanium source gas continue to be introduced into the reactor chamber 101. When a desired thickness for the doped SiGe:C film 212 is achieved, the flows of the silicon source gas and the germanium source gas are halted. Additionally, in one embodiment, the carbon source gas flow is also stopped at the same time the silicon source gas and the germanium source gas are halted.

In one embodiment, a silicon cap (not shown) is formed over the doped SiGe:C film 212. In this embodiment, the flow of the silicon source gas continues to be introduced into the reactor chamber 101 after the germanium source gas and the carbon source gas have halted. The flow of the silicon source gas is continued for a short duration sufficient to form a silicon cap of about 10-20 nm in thickness over the SiGe:C film 212. The silicon source gas flow is subsequently stopped once the silicon cap is completed.

Figure 3E:
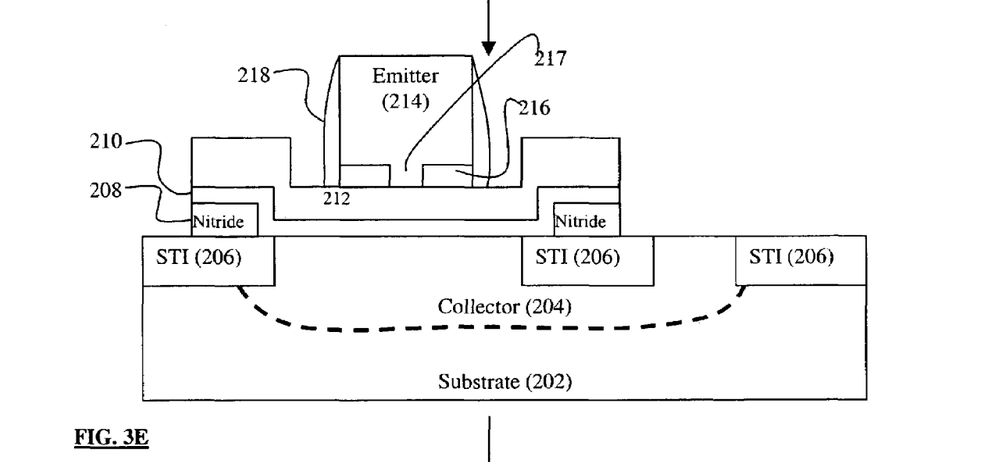

At FIG. 3E, an emitter region 214 is formed on top of the SiGe:C film 212. In one embodiment, insulation regions, e.g. nitride regions 216, are first formed on the surface of the SiGe:C film 212. The insulation regions can be comprised of nitride, oxide, or other dielectric material. In one embodiment, a nitride film is first formed over an area of the top surface of the SiGe:C film 212 using conventional methods. The nitride film is then etched or patterned to create an opening 217 and the nitride regions 216. In this embodiment, a silicon film, which may contain an n-type or p-type impurity, is then formed in the opening 217 and over the nitride regions 218 to form the emitter region 214. The insulation regions allow the emitter region 214 to be as narrow as possible (for better device performance) especially where the emitter region 214 contacts the base region 211 made up of the silicon seed layer 210 and the SiGe:C film 212. In one embodiment, monocrystalline silicon is deposited into the opening 217 and over the nitride regions 218 to form the emitter region 214. In another embodiment, the emitter region 214 is formed by depositing a polycrystalline silicon into the opening 217 and over the nitride regions 218. The emitter region 214 may have a thickness of about 60-200 nm.

In one embodiment, ion implantation and activation annealing are performed so as to dope the surface region of the emitter region 214 with an n-type impurity or a p-type impurity. When the base region 211 is a p-type base region, the emitter region 214 is formed to be an n-type emitter region; and when the base region 211 is an n-type base region, the emitter region 214 is formed to be a p-type emitter region. The n-type impurity may have a concentration as high as $5 \times 10^{20}$ carriers per $cm^3$ or higher if necessary. Additionally, spacers 218 may be formed on the side wall of the emitter region 214 using conventional methods.

Figure 3F:
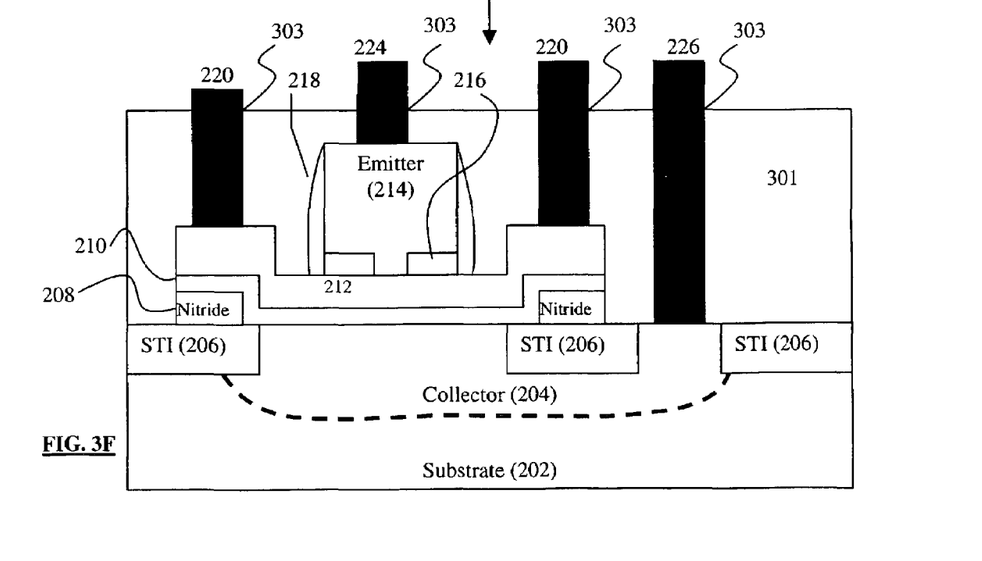

FIG. 3F illustrates that contacts may be formed for each of the emitter region 214, the SiGe:C base layer 212 and the collector region 204 using conventional methods. For example, an insulation layer 301 may be formed over the surfaces of the emitter region 214, the SiGe:C base layer 212, and the collector region 204. Then, openings 303 can be created into the insulation layer to create space where the contacts can be formed. Contact 224 made of conductive material (e.g., copper or tungsten) is formed for the emitter region 214, contacts (e.g., copper or tungsten) 220 are formed for the SiGe:C base layer 212, and contact (e.g., copper or tungsten) 226 is formed for the collector region 204.

Figure 4:
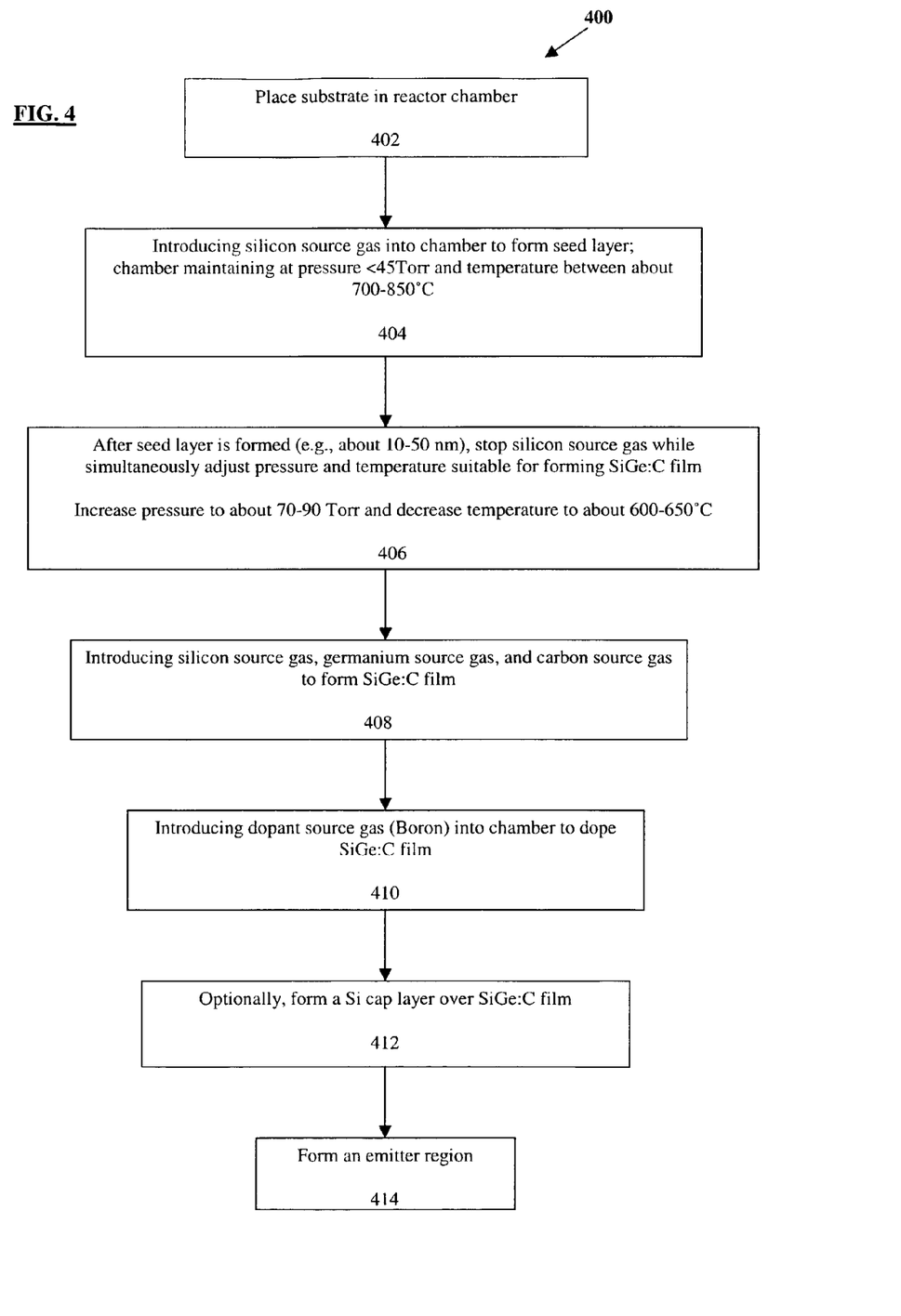
FIG. 4 illustrates an exemplary method of making a base region in an HBT.

FIG. 4 illustrates an exemplary method 400 of fabricating a base region in a semiconductor device such as a HBT. At box 402, a substrate is placed in a reactor chamber such as reactor chamber 101 described above. The substrate can be the substrate 202 described above in FIG. 3A. At box 404, a silicon source gas (e.g., $SiH_4$) is introduced into the reactor chamber to form a silicon seed layer over the substrate in the manner as previously described. In one embodiment, the seed layer is the silicon seed layer 210 described above. The reactor chamber is maintained at a pressure below 45 Torr, or ideally, between 10 Torr and 30 Torr, and at a temperature between about 700° C. and 850° C. The silicon source gas may be introduced into the reactor chamber with a carrier gas as previously described. The silicon source gas is fed into the chamber for a short amount of time sufficient to form a substantially uniform seed layer of about 20-120 nm thick.

At box 406, after the seed layer is formed, the silicon source gas flow is stopped and the pressure and temperature of the reactor chamber are simultaneously adjusted to a condition suitable for forming a SiGe:C film. As mentioned above, the silicon seed layer can be formed at a higher temperature and substantially lower pressure condition than that required for the SiGe:C film because of a need to incorporate carbon substitutionally into the SiGe:C film. Thus, prior to forming the SiGe:C film, the temperature and pressure should be adjusted accordingly. In one embodiment, the pressure is adjusted to about 70-90 Torr and the temperature is adjusted to about 600-650° C., simultaneously.

At box 408, the silicon source gas (e.g., $SiH_4$), a germanium source gas (e.g., $GeH_4$), and a carbon source gas (e.g., $CH_3SiH_3$) are introduced into the reactor chamber in the manner as previously described to form the SiGe:C film. In one embodiment, the SiGe:C film is the SiGe:C film 212 described above. The silicon source gas, the germanium source gas, and the carbon source gas are introduced for a duration of time sufficient to form a SiGe:C film of about 10-150 nm thick. At box 410, a dopant source gas (e.g., diborane) is introduced into the reactor chamber to dope the SiGe:C film. Optionally, at box 412, a silicon cap layer is formed over the SiGe:C film. In this case, the germanium source gas, the carbon source gas, and the dopant source gas are halted while the silicon source gas is continued for a short duration of time sufficient to form a thin silicon cap layer, and in one embodiment, of about 10-20 nm. At box 414, an emitter region is formed using methods previously described.

Figure 5:
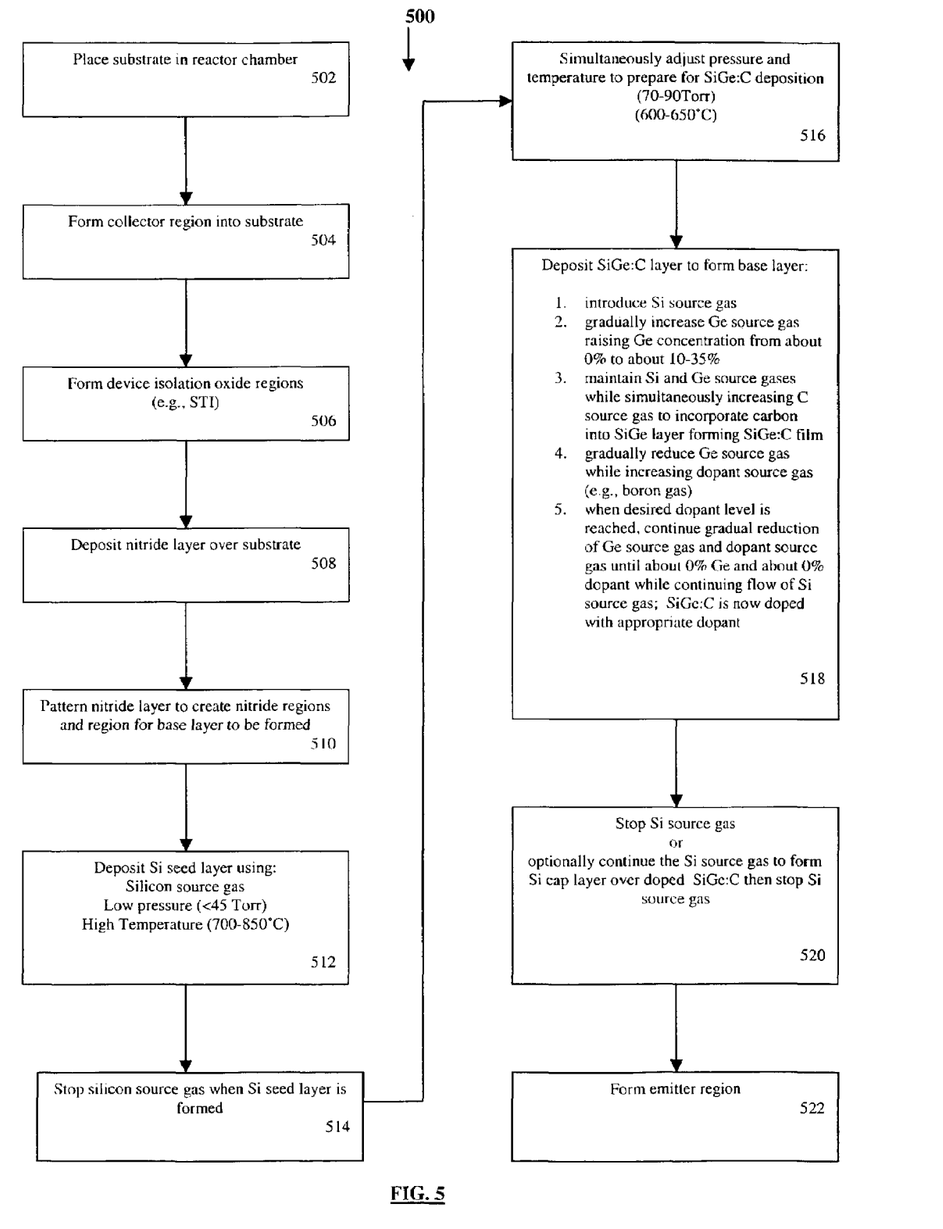
FIG. 5 illustrates another exemplary method of making an HBT.

FIG. 5 illustrates an exemplary method 500 of fabricating a semiconductor device such as a HBT. At box 502, a substrate is placed in a reactor chamber such as reactor chamber 101 described above. The substrate can be the substrate 202 described above in FIG. 3A. At box 504, a collector region is formed into the substrate using conventional methods. In one embodiment, the collector region is formed on an epitaxial portion of the substrate. The collector region may be formed by using methods such as solid-state diffusion or ion-implantation to implant impurities into certain region of the substrate to make the collector region an n-type collector region or a p-type collector region.

At box 506, device isolation regions are formed into the substrate using conventional methods. In one embodiment, the top layer of the substrate, which in some cases is the epitaxial layer, is locally oxidized (for example by the LOCO (local oxidation of silicon) method so as to form the isolation regions. In some embodiments, the surface of the substrate including the collector region and the device isolation regions are planarized using conventional methods.

At box 508, a nitride layer is formed over the substrate using conventional methods. At box 510, the nitride layer is patterned (or etched) to create nitride regions and regions for which a base region will be formed.

Next, a base region is formed. In one embodiment, the base region of the device comprises a silicon seed layer and a SiGe:C film, which will now be described. At box 512, a silicon seed layer is formed using method similar to that described in FIG. 4 at box 404. The silicon seed layer is thus formed using a silicon source gas (e.g., $SiH_4$) and at a pressure below 45 Torr, or ideally, between 10-30 Torr, and at a temperature between 700-850° C. and more ideally, at 30 Torr and 725° C. At box 514, the silicon source gas is stopped after the silicon seed layer is formed.

At box 516, the reactor chamber is adjusted to prepare the reactor for the deposition of a SiGe:C film. In one embodiment, the reactor chamber is simultaneously adjusted to a pressure between about 70-90 Torr and a temperature between about 600-650° C., to a pressure of about, and ideally, 80 Torr and a temperature of about 600° C. Then, at box 518, the SiGe:C film is formed.

In one embodiment, the SiGe:C film comprises graded germanium. As illustrated in box 518, first, the silicon source gas is introduced. Second, the germanium source gas is gradually increased raising the concentration of germanium in the film from about 0% to about 10-35%. Third, the silicon source gas and the germanium source gas are maintained while simultaneously, the carbon source gas is gradually increased to incorporate carbon substitutionally into the film forming the SiGe:C film. Fourth, to dope the SiGe:C film, a dopant source gas is gradually increased while the germanium source gas is gradually reduced. The dopant source gas can be boron or indium to form a p-type base region or phosphorous or arsenic to form an n-type base region. When the collector region is an n-type collector region, the base region is a p-type base region; and when the collector region is a p-type collector region, the base region is an n-type base region. Fifth, when the desired dopant level is reached, the germanium source gas is continued to be reduced and now, the dopant source gas is gradually reduced together with the germanium source gas until there is about 0% of the germanium source gas and the dopant source gas present in the reactor chamber. At the same time, the silicon source gas is continued at its constant rate.

At box 520, the silicon source gas is stopped after the all of the germanium and the carbon source gases are stopped. Alternatively, the silicon source gas is continued for a duration of time that is sufficient to form a silicon cap layer over the doped SiGe:C film. This duration of time may be in the order of seconds depending on the desired thickness of this silicon cap layer.

At box 522, an emitter region is formed using methods previously described. The emitter region is formed to be an n-type emitter region or a p-type emitter region. When the base region is a p-type base region, the emitter region is an n-type emitter region and when the base region is an n-type base region, the emitter region is a p-type emitter region.

The silicon seed layer and the SiGe:C film formed in according to the methods described above is continuous thus minimizing the problem of SiGe:C not being able to continuously form over different type of surfaces such as silicon, oxide, and nitride.

In some embodiments, a carrier gas is introduced into the reactor chamber throughout the depositions. In one embodiment this carrier gas is hydrogen ($H_2$). $H_2$ is introduced into the reactor chamber as a carrier gas at 20 standard liters per minute (slpm) through associated manifold flow control 113 from hydrogen source 112. In other embodiments, $H_2$ flow can vary from 5 slpm to 50 slpm.

In one embodiment, a system controller performs the exemplary methods previously described. The system controller can be the system controller 130 previously mentioned that can execute a memory device having process instructions like the memory storage device 140. When executed, the instruction can perform the process of fabricating a semiconductor device in accordance to some exemplary embodiments. In one embodiment, the instructions when executed can place a substrate in a reactor chamber, introduce a silicon source gas to form a silicon seed layer while maintaining the reactor chamber at a pressure below 45 Torr, or ideally, between 10-30 Torr and a temperature between about 700° C. and 850° C., or ideally, at about 725° C. The instructions can also stop the silicon source gas after the silicon seed layer is formed, simultaneously adjust the reactor chamber to a pressure between about 70 Torr and 90 Torr, or ideally at about 80 Torr and a temperature between about 600° C. and 650° C., and introduce the silicon source gas, a germanium source gas, and a carbon source gas to form a SiGe:C film.

In another embodiment, the instructions when executed can place a substrate in a reactor chamber, form a collector region into the substrate and form a device isolation field. The instructions further can form a base region over an area of the collector region by introducing a silicon source gas to first form a silicon seed layer over the area on the collector region while maintaining a pressure below 45 Torr, or ideally, between 10-30 Torr, and a temperature between about 700° C. and 850° C., or ideally, at about 725° C., and stopping the silicon source gas after the silicon seed layer is formed. Next, the instructions adjusts the reactor chamber to a pressure between about 70 Torr and 90 Torr or, ideally at about 80 Torr and a temperature between about 600° C. and 650° C., or ideally, at about 600° C. and introduces the silicon source gas, a germanium source gas, and a carbon source gas into the reactor chamber to form a SiGe:C film over the silicon seed layer. And, the instructions can also form an emitter over an area of the base region.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. A method of fabricating a bipolar transistor comprising:
   placing a substrate in a reactor chamber;
   forming a collector region into said substrate;
   forming a device isolation field comprising silicon oxide;
   forming nitride regions over the substrate;
   introducing a silicon source gas into said reactor chamber to form a silicon seed layer over an area on said collector region, device isolation field and said nitride regions, said reactor chamber having a pressure between 10-30 Torr and a temperature between about 700° C. and 850° C. and stopping said silicon source gas after said silicon seed layer is formed;
   simultaneously adjusting said reactor chamber to a pressure between about 70 Torr and 90 Torr and a temperature between about 600° C. and about 650° C. , and introducing said silicon source gas, a germanium source gas, and a carbon source gas into said reactor chamber to form a SiGe:C film over said silicon seed layer, said SiGe:C film being graded with a concentration up to 35% and with carbons forming into substitution sites in the SiGe:C film;
   wherein said silicon seed layer and said SiGe:C film form a base region; and
   forming an emitter over an area of said SiGe:C film.

2. The method of claim 1 wherein said SiGe:C film is graded wherein said introducing said silicon source gas, said germanium source gas, and said carbon source gas to form said SiGe:C film comprising:
   introducing said silicon source gas into said reactor chamber;
   gradually increasing said germanium source gas in said reactor chamber to form said SiGe:C film that is graded from about 0% germanium to about 10-35% germanium; and
   introducing said carbon source gas into said reactor chamber to incorporate carbon into said SiGe:C film.

3. The method of claim 1 further comprising: introducing a dopant source gas into said reactor chamber to dope said SiGe:C film such that said dopant source gas is flashed into said reactor chamber for a few seconds.

4. The method of claim 3 wherein said SiGe:C film is graded wherein said introducing said silicon source gas, said germanium source gas, and said carbon source gas to form said SiGe:C film comprising:
   introducing said silicon source gas into said reactor chamber;

gradually increasing said germanium source gas in said reactor chamber to form said SiGe:C film that is graded from about 0% germanium to about 10- 35% germanium; and introducing said carbon source gas into said reactor chamber to incorporate carbon into said SiGe:C film; and wherein said introducing said dopant source gas into said reactor chamber to dope said SiGe:C film comprises gradually reducing said germanium source gas while increasing said dopant source gas; and gradually reducing said germanium source gas and said dopant source gas to 0% after a desired thickness for said SiGe:C film is achieved.

5. The method of claim 3 wherein said dopant source gas is a boron source gas and wherein said method further comprises forming a region comprising boron with a concentration up to $2\times10^{20}$ atoms/cm$^3$.

* * * * *